United States Patent
Taddeo

Patent Number: 5,436,882
Date of Patent: Jul. 25, 1995

[54] METHOD AND DEVICE FOR IMPROVING DIGITAL AUDIO SOUND

[76] Inventor: Anthony R. Taddeo, 800 Corwin Rd., Rochester, N.Y. 14610

[21] Appl. No.: 253

[22] Filed: Jan. 4, 1993

[51] Int. Cl.$^6$ .................. H04N 5/76; G11B 5/00; H03M 1/06
[52] U.S. Cl. .................. 369/60; 341/118; 360/8
[58] Field of Search .................. 369/60, 59, 124; 333/173, 70, 168, 172; 330/20, 138; 358/320, 325, 324, 337, 160, 167; 381/97, 95, 96; 360/32, 36.1, 53, 7, 8, 9.1, 24, 26; 455/96, 95, 305, 306, 307, 72; 341/118

[56] References Cited

U.S. PATENT DOCUMENTS

| | | | |
|---|---|---|---|
| 3,555,439 | 4/1968 | Tarr et al. | 455/307 |
| 3,769,611 | 10/1973 | Scaggs | 330/126 |
| 3,858,126 | 12/1974 | Kameya | 333/168 |
| 3,906,157 | 9/1975 | Boner et al. | 381/98 |
| 3,925,605 | 12/1975 | Rennick | 369/60 |
| 4,061,905 | 12/1977 | Fettweis | 333/70 |
| 4,117,413 | 9/1978 | Moog | 330/126 |
| 4,130,727 | 12/1978 | Kates | 381/98 |
| 4,169,219 | 9/1979 | Beard | 369/124 |
| 4,254,500 | 3/1981 | Brookhart | 360/53 |
| 4,328,465 | 5/1982 | Takaoka et al. | 330/126 |
| 4,388,729 | 6/1983 | Spencer et al. | 455/72 |
| 4,492,928 | 1/1985 | Hayakawa et al. | 330/126 |
| 4,553,103 | 11/1985 | Rollett | 330/126 |
| 4,812,851 | 3/1989 | Giubardo | 455/307 |
| 4,972,489 | 11/1990 | Oki et al. | 381/97 |
| 4,977,461 | 12/1990 | Ichimura | 369/60 |
| 5,075,781 | 12/1991 | Muramoto | 358/337 |

OTHER PUBLICATIONS

A Digital "Phase Shift" for Musical Applications. Using the Bell labs (Alles–Fischer) Digital Filter Module, Michael L. Beigel, Nov. 1978, pp. 673–676.

*Primary Examiner*—Georgia Y. Epps
*Assistant Examiner*—Nabil Hindi
*Attorney, Agent, or Firm*—Shlesinger Fitzsimmons Shlesinger

[57] ABSTRACT

An analog signal which forms part of a digital audio recording system is split into at least two signal paths in one of which it is delayed slightly before being recombined with each signal of the other signal path or paths. The delay can be effected by using a multistage filter in the delay line, which causes the signal in the delay line to be delayed for a period of time equal to a fraction of one cycle of the sampling frequency of the associated digital recording system. The slight delay eliminates or minimizes undesirable phase shifting which is created in the analog signal by the sampling frequency.

8 Claims, 2 Drawing Sheets

METHOD AND DEVICE FOR IMPROVING DIGITAL AUDIO SOUND

BACKGROUND OF THE INVENTION

This invention relates to a novel method and means for improving the quality of audio sound produced by digital recordings, and more particularly to a combined signal splitting and delay device for removing time domain errors and the like from signals produced by digital audio reproduction systems.

The field of audio recording and reproduction has reached extremely sophisticated levels. At the same time, listener sophistication likewise has increased to the point where serious audiophiles can detect even the slightest distortion in the output of contemporary audio equipment—including, compact disc equipment. Much of the more sophisticated audio equipment currently available in the marketplace is designed to produce a digital rather than an analog recording. While much improved over that of analog signal recordings, nevertheless the signal output of a digital recording, for example, the output from a compact disc player, because of undesirable phase shift, often includes time domain errors which can be displeasing to the above-noted audiophiles.

There are currently available in the marketplace some devices for removing or minimizing time domain errors of the type described, but most of this equipment is extremely expensive, and is designed to process the recorded digital signals in the digital stage. The Wadia Digimaster X-32 digital decoding computer, for example, is designed to solve some of the above-noted problems, but is very expensive and is quite large dimensionally.

As referred to hereinafter, the term "sampling frequency" means the informational sampling frequency at which an analog signal is sampled by the A/D converter which is used to convert an analog signal to a digital signal for the purpose of producing a digital recording of that analog signal. For example, for producing a compact disc recording the sampling rate or frequency normally is approximately 44.1 kHz., while for production of a digital audio tape this frequency is approximately 48 kHz. In any event the sampling frequency or rate as used in connection with this invention is not to be confused with the technique of over-sampling which normally occurs at higher frequencies.

It should be noted also that the sampling frequency utilized in the production of digital recordings also has the effect of introducing some slight, undesirable phase shift in the reconstructed analog output signal which is produced by a D/A converter from a digital recording. This phase lead can result in some slight distortion of the reconstructed audio signal.

Accordingly, it is an object of this invention to provide an improved signal processing method for removing undesirable time domain errors from the output signals of digital recordings such as CD players and the like.

A more specific object of this invention is to provide a novel device of the type described which splits and processes the analog signal produced by a digital source, thereby to improve the resulting audio sound.

Still another object of this invention is to provide a device of the type described which is substantially more inexpensive and simpler to produce than prior signal processing devices.

Other objects of this invention will be apparent hereinafter from the specification and from the recital of the appended claims, particularly when read in conjunction with the accompanying drawings.

SUMMARY OF THE INVENTION

The device includes a circuit which splits into two separate paths and thereafter recombines an incoming analog signal that is produced by the output of a digital recording, such as a CD player or the like. In one of the pathways the signal travels directly (without delay) to an output terminal where the signals are recombined, while the signal in the other pathway is delayed for a period of time equal to a fraction of the time (e.g., $\frac{1}{4}$, $\frac{1}{2}$, $\frac{3}{4}$) it takes to complete a full wave length at a given sampling frequency. For example, in a typical CD recording system having a sampling frequency of 44.1 kHz, a delay amounting to a half cycle would be equal to approximately 11 microseconds. The two signal paths are then recombined at the output of the device, and the ratio of the amplitude of the recombined signals can vary from approximately $\frac{1}{4}$ to 1 or 4 to 1. If desired this ratio can be adjusted by varying the manner in which the incoming signal is split.

By splitting the signal into two or more paths, it is possible to delay the signal in selected paths to a predetermined fraction of the wave length at the sampling frequency. The splitting and delay of the signal in a given path appears to induce a desired phase shift or offset, which, when the signal paths are recombined, cancels the above-noted phase shift introduced by the sampling rate. The result is that the harmonic overtone structure is reproduced more accurately. Likewise, there is a marked reduction in jitter and latching noise in the recombined signal as the result of averaging of the signals in the delayed and non-delayed signal paths, thus reducing instantaneous amplitude.

THE DRAWINGS

DETAILED DESCRIPTION OF THE PREFERRED EMBODIMENTS

Figures 1, 2:
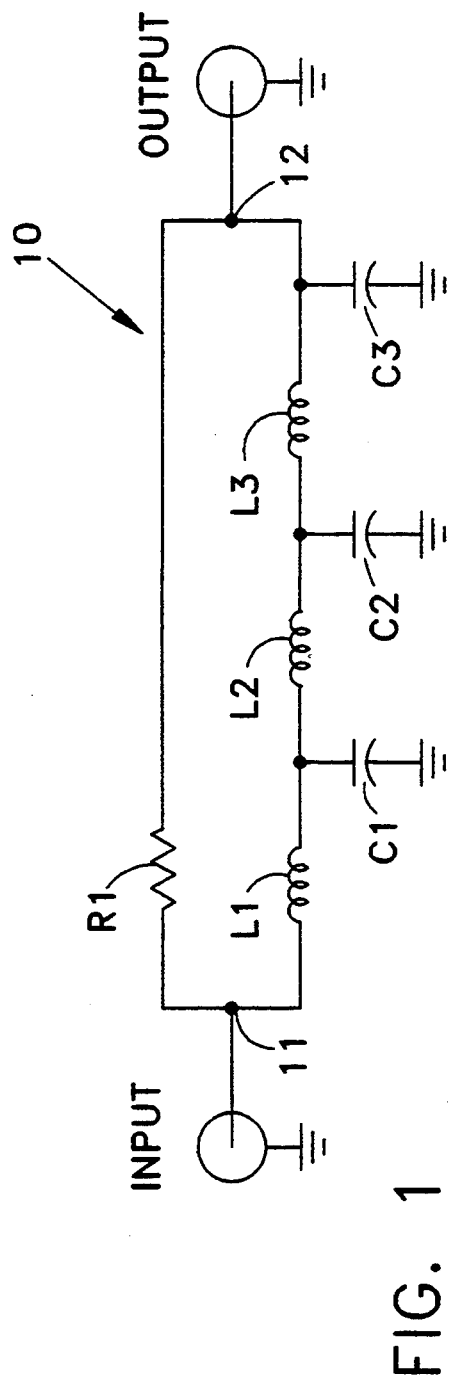
FIG. 1 is a wiring diagram illustrating a one channel passive-type signal processing device made according to one embodiment of this invention.
FIG. 2 is a wiring diagram illustrating a one channel active-type signal processing device made according to a second embodiment of this invention.

Referring now to the drawings by numerals of reference, and first to FIG. 1, 10 denotes generally a novel signal processing device comprising an input terminal 11 disposed to receive an analog input signal from a digital source, such as for example the output of a CD player or the like. This input signal is split at terminal 11 into two signals, one of which is applied without delay through a voltage divider in the form of a resistor R1 to the output terminal 12 of the device. The other part of the split signal is fed through a three stage filter to the output terminal 12 where it is recombined with the signal which is applied through resistor R1. As shown in FIG. 1 the three stage filter comprises three coils L1, L2 and L3, which are connected in series between terminals 11 and 12, and three capacitors C1, C2 and C3, each of which is connected at one side to ground. At its opposite side capacitor C1 is connected between coils L1 and L2; capacitor C2 is connected at its opposite side to the junction between coils L2 and L3, and capacitor C3 is connected at its opposite side to the junction between coil L3 and the output terminal 12.

The circuit illustrated in FIG. 1 is designed for a relatively low output impedance from the CD output. Moreover, it will be understood that this circuit is designed to process the signal received from only one channel of a CD output, so that if a stereo output is being processed, a similar signal processing circuit will be used for each channel. During use, the L/C branch of circuit 10 constitutes a three section delay line, while the branch containing the resistor R1 is chosen to balance the signal between the two paths. Simply by way of example, resistor R1 may have a value of approximately 3.3k ohms, each of the coils L1–L3 may be approximately 15 mh, while each of the capacitors may have a value of approximately 0.0015 microfarads. Optionally, an additional resistor in the range of 1k ohms can be placed between the incoming signal and the input terminal 11.

The passive circuit as illustrated in FIG. 1 may be viewed as comprising either delayed and direct paths, or it may be viewed as a feed-back loop with delay in either the direct path or the feed-back path.

Referring now to FIG. 2, 20 denotes generally an active signal processing circuit which can be incorporated, for example, in one of the output channels of a CD player or the like. In this embodiment the low impedance analog signal derived from the digital recording is applied to the input terminal 21 of the device, where it is split into two paths. In one of these paths the signal is applied through a variable resistor R3 to the output terminal 22 of the device. The other path or delay line section of the circuit has incorporated therein a buffered second order allpass filter. More specifically, the delay line of device 20 comprises a resistor R4 connected at one end to the input terminal 21 and at its opposite end to one side of a capacitor C5. At its opposite side C5 is connected through a resistor R5 to ground, and to one input of a first amplifier 25, the output of which is applied by a feed-back circuit 26 to the other input of amplifier 25. The output of amplifier 25 is also applied through the series connected resistors R6 and R7 to the negative input of another amplifier 27, the output of which is fed back through a resistor R8 to the negative input of amplifier 27. The resistor R6 is adjustable by a feed-back circuit 28 tapped from between resistors R6 and R7.

The output of amplifier 25 is also applied through a resistor R9 to the other input (the positive terminal) of the amplifier 27, the output of which is applied also through series connected resistors R10 and R11 to ground, and to one side of a capacitor C6, the opposite side of which is connected to the output terminal 22 of device 20. Also, opposite ends of resistor R9 are connected through capacitors C7 and C8, respectively, with the junction between resistors R10 and R11.

Simply by way of example, the values of the components illustrated in FIG. 2 include for resistors R3, R4, R5, R6, R7, R8, R9, R10 and R11 the ohmic values of, respectively, 500k, 100k, 47k, 5k, 10k, 15k, 6.8k, 6.2k and 2.2k. Capacitors C5 and C6 may be rated at 2 microfarads, and capacitors C7 and C8 may have values of 0.0012 microfarads.

Figure 3:
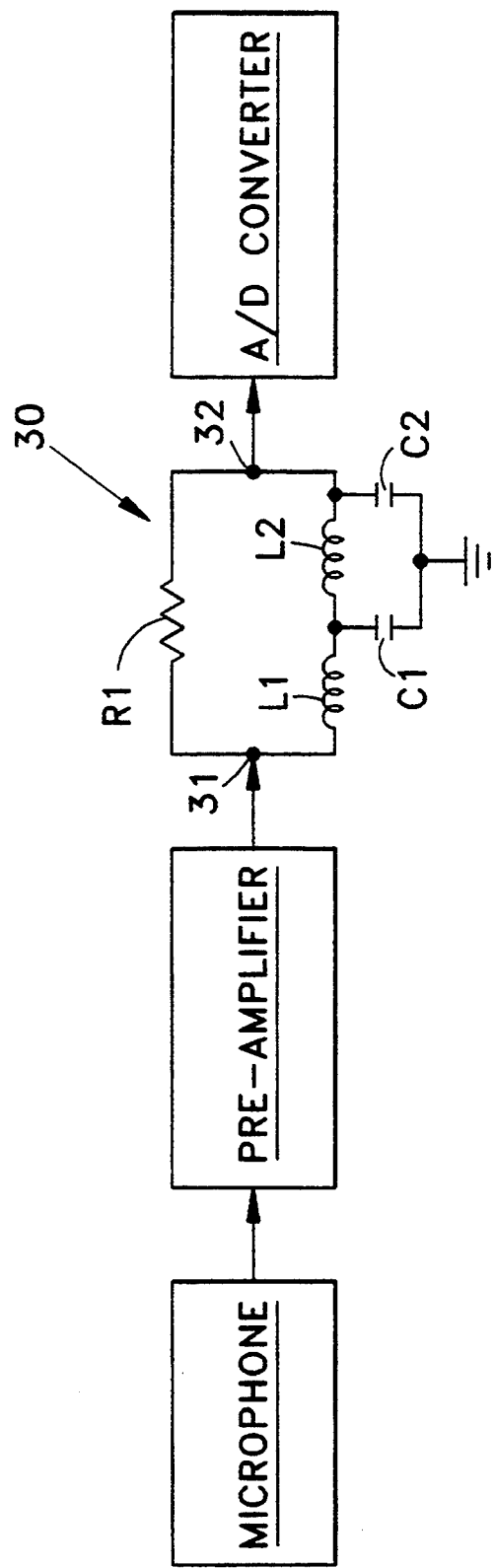
FIG. 3 is a diagramatic illustration of steps involved in utilizing a device made according to this invention for processing an analog signal before it is converted into a digital signal recording.

In connection with the embodiments shown in FIGS. 1 and 2, it is to be understood that the recombined signals from the output terminals 12 and 22 are applied in known manner to an amplifier circuit for ultimately producing an audible sound. While these devices thus are particularly suitable for use in connection with processing an analog signal generated by the output of a digital recording, it is to be understood that they also may be incorporated in another section of a recording process. For example, as illustrated in FIG. 3, the output of a microphone, after it has been passed through a pre-amplifier circuit, could be applied to the input terminal 31 of a signal processor denoted generally in FIG. 3 by the numeral 30. The processor 30 as illustrated in FIG. 3 is similar to that disclosed in FIG. 1, except that it utilizes in its delay path or line only a two stage filter rather than a three stage filter as shown in FIG. 1. After being processed by the circuit 30 the recombined signal, which appears at the output terminal 32 of the device 30, is applied to a conventional analog to digital converter device for recording directly onto a CD or the like. When used in this manner the device retains the sonic benefits of improved time/phase domain performance, although it does not remove some of the switching or jitter noises which would be removed if the device were to be utilized as shown in FIGS. 1 and 2, at the output end of the CD player.

From the foregoing it will be apparent that the present invention provides a relatively simple and inexpensive method and means for improving the audio output signal of a CD player or the like. By designing the delay branch of the circuit to effect a slight delay, for example from one quarter to a full cycle of the sampling frequency, or for example by adjusting voltage dividing resistor R3, as shown FIG. 2, in order to vary the amount of mix between the straight feed path and the delayed feed path, it is possible to flatten out the frequency response, or to effect a change in the phase response, and thereby to eliminate time domain errors which might otherwise be passed to the amplifier circuit of a digital audio reproduction system.

While the invention has been illustrated and described in detail in connection with a method and device for splitting into two paths the analog signal coming from or being delivered to digital recording equipment, it will be apparent that the signal could be divided into more than two separate paths before being recombined, and that one or more of such additional paths could be of the above-noted direct or delayed signal type of path without departing from this invention. Moreover, it will be apparent also that the exact means for effecting delay of the signal in a given path can be replaced by equivalent means, such as for example charged—coupled devices. Moreover, it will be apparent that this invention is capable of still further modification, and that this application is intended to cover any such modifications as may fall within the scope of one skilled in the art or the appended claims.

I claim:

1. A method of cancelling undesirable phase shift and signal jitter from an analog output signal produced by a D/A converter from a digital recording which had been produced by an A/D converter by sampling the analog input signals to the A/D converter at a predetermined sampling frequency, comprising splitting the analog output signal produced from the recording into a plurality of different signal paths connected in parallel between an input terminal and an output terminal, passing the output signal in one of said paths from said input terminal to said output terminal substantially without delay, and delaying passage of the output signal in another of said paths from said input to said output terminal for a period of time equal to from anywhere from a fraction to approximately one full wave of length of said sampling frequency.

2. A device for processing an analog output signal produced by a D/A converter from a digital recording which had been produced by an A/D converter by sampling the analog input signals to the A/D converter at a predetermined sampling frequency, comprising a signal input terminal disposed to be connected to the source of an analog output signal produced by a D/A converter from a digital recording, a signal output terminal, a plurality of separate signal paths connected in parallel between said inlet terminal and said outlet terminal, whereby the analog output signal applied to said inlet terminal is split and travels in each of said paths to said outlet terminal, means in one of said paths causing the signal in said one path to travel substantially without delay from said input terminal to said output terminal, and means in another of said paths operative to delay the passage of the signal in said other path from said input to said output terminal for a period of time equal to from anywhere from a fraction to approximately one full cycle of said sampling frequency.

3. A device as defined in claim 2, wherein said means in said one path includes a resistor for splitting said analog output signal between said one path and said other path.

4. A device as defined in claim 2, wherein said means in said other path comprises a multi-stage filter interposed between said input and output terminals.

5. A device as defined in claim 2, wherein said means in said other path comprises a buffered second order allpass filter interposed between said input and output terminals.

6. A method of preventing undesirable phase shift in an analog output signal produced by a D/A converter from a digital recording of the type which is produced by an A/D converter which samples an analog input signal to the A/D converter at a predetermined sampling frequency, comprising splitting an analog input signal to the A/D converter into a plurality of different signal paths before the input signal reaches the A/D converter, said signal paths being connected in parallel between an input terminal, and an output terminal which is connected to the input of said A/D converter, passing the signal in one of said paths from said input terminal to said output terminal and to the input of said converter substantially without delay, and delaying passage of the signal in another of said paths from said input to said output terminal for a period of time equal to from anywhere from a fraction to approximately one full wave length of said sampling frequency.

7. A device for preventing undesirable phase shift in an analog output signal produced by a D/A converter from a digital recording of the type which is produced by an A/D converter by sampling the analog input signal to the A/D converter at a predetermined sampling frequency, comprising a signal inlet terminal connected to an analog signal source, an outlet terminal connected to the input of an A/D converter, a plurality of separate signal paths connected in parallel between said inlet terminal and said outlet terminal, whereby the analog signal applied to said inlet terminal is split and travels in each of said paths to said outlet terminal, means for passing the signal in one of said paths from said input terminal to said output terminal and to the input of said A/D converter terminal substantially without delay, and means for delaying passage of the signal in another of said paths from said input to said output terminal for a period of time equal to from anywhere from a fraction to approximately one full wave length of said sampling frequency.

8. A device as defined in claim 7, wherein said inlet terminal is connected to the output of a pre-amplifier.

* * * * *